US005745847A

United States Patent [19]

Matsuo

[11] Patent Number: 5,745,847

[45] Date of Patent: Apr. 28, 1998

[54] AUTOMATIC GAIN CONTROL CIRCUIT CAPABLE OF COMPENSATING VARIATION OF RECEPTION LEVEL WITH WIDE RANGE

[75] Inventor: Tomohide Matsuo, Tokyo, Japan

[73] Assignee: NEC Corporation, Tokyo, Japan

[21] Appl. No.: 686,090

[22] Filed: Jul. 24, 1996

[30] Foreign Application Priority Data

Jul. 27, 1995 [JP] Japan .................................... 7-192240

[51] Int. Cl.[6] ................................ H04B 1/06; H04B 1/16

[52] U.S. Cl. ..................................... 455/234.1; 455/245.1; 455/247.1; 330/279

[58] Field of Search .............................. 455/234.1, 232.1, 455/245.1, 243.1, 241.1, 236.1, 239.1, 242.1, 242.2, 245.2, 247.1, 249.1, 250.1; 330/279, 133, 134; H04B 1/06, 1/16

[56] References Cited

U.S. PATENT DOCUMENTS 4,580,287 4/1986 Richards, Jr. ........................ 455/245.1
4,955,077 9/1990 Sugayama ............................ 455/234.1
5,507,023 4/1996 Suganuma et al. .................. 455/234.1
5,513,387 4/1996 Saito et al. ........................... 455/241.1
5,659,582 8/1997 Kojima et al. ....................... 455/234.1

FOREIGN PATENT DOCUMENTS 4-271585 9/1992 Japan ............................... H04N 5/44

*Primary Examiner*—Amelia Au
*Assistant Examiner*—Vu Le
*Attorney, Agent, or Firm*—Ostrolenk, Faber, Gerb & Soffen, LLP

[57] ABSTRACT

An RF AGC control circuit (47) gives a first initial voltage signal generated by a first initial level generating circuit (44) to an RF amplifier circuit (22) during a predetermined time duration T, when the channel selection signal was updated or when power supply is turned to on. After lapse of the predetermined time duration T, the RF AGC control circuit gives to the RF amplifier circuit a level difference signal representative of a level difference between output of an optimum level generating circuit (46) and output of a comparator (43). On the other hand, an IF AGC control circuit (48) gives a second initial voltage signal generated by a second initial level generating circuit (45) to an IF amplifier circuit 31 during the predetermined time duration T, when the channel selection signal was updated or when the power supply is turned to on. The IF AGC control circuit gives the output of the comparator to the IF amplifier circuit after lapse of the predetermined time duration T.

4 Claims, 4 Drawing Sheets

AUTOMATIC GAIN CONTROL CIRCUIT CAPABLE OF COMPENSATING VARIATION OF RECEPTION LEVEL WITH WIDE RANGE

BACKGROUND OF THE INVENTION

This invention relates to an automatic gain control circuit and a reception front end device comprising the automatic gain control circuit. The automatic gain control circuit is particularly suitable for a television receiver which receives a CATV (Cable Television) signal or a wire-less television signal.

The television receiver comprises a tuner comprising an RF (Radio Frequency) amplifier circuit, a visual detector circuit, and a control unit for controlling the tuner and the visual detector circuit. The tuner receives an RF (Radio Frequency) signal and selects a specific frequency signal of a specific channel, namely, a reception channel, designated by a channel switching signal. Furthermore, the tuner amplifies the specific frequency signal into an amplified frequency signal and then converts the amplified frequency signal into an IF (Intermediate Frequency) signal of the specific channel. The visual detector circuit converts the IF signal into a composite video signal.

The control unit receives a channel selection signal designating the reception channel from an outer unit and delivers the channel switching signal to the tuner. Furthermore, the control unit controls the RF amplifier circuit by supplying an RF AGC (Automatic Gain Control) voltage control signal to the RF amplifier circuit. The RF amplifier circuit is controlled in amplification degree. For this purpose, the control unit comprises a memory unit memorizing a plurality of AGC voltage control information in each of a plurality of channels. By the use of the plurality of AGC voltage control information, the control unit controls the tuner so that the tuner produces the IF signal having an appropriate level. However, each of the plurality of AGC voltage control information is a fixed value in each of the plurality of channels and is determined taking level variation of the RF signal into consideration. This means that the television receiver has the following disadvantage.

As will later be described, there is a case that the RF signal has a larger level variation larger than it had expected. In this case, it is impossible to compensate the level variation of the RF signal by only controlling the amplification degree of the RF amplifier circuit.

SUMMARY OF THE INVENTION

It is therefore an object of this invention to provide an automatic gain control circuit which is capable of compensating level variation of a reception RF signal with a wide range.

It is another object of this invention to provide a reception front end device which comprises the automatic gain control circuit of the type mentioned above.

According to one aspect of this invention, an automatic gain control circuit comprises a level detection circuit for detecting a reception level by utilizing an output signal produced from a demodulation circuit of a television signal. The automatic gain control circuit produces an automatic gain control voltage signal according to the reception level and further comprises: a reference level generating circuit for generating a reference voltage signal having a predetermined reference level; a comparator for comparing the reception level with the predetermined reference level to produce a first level difference signal representative of a first level difference between the reception level and the predetermined reference level; a first initial level generating circuit for generating a first initial voltage signal having a first initial level; a second initial level generating circuit for generating a second initial voltage signal having a second initial level; an optimum level generating circuit supplied with a channel selection signal designating a reception channel for generating a channel reference level signal having a preselected level that corresponds to the reception channel designated by the channel selection signal; an RF AGC control circuit connected to the comparator, the first initial level generating circuit, and the optimum level generating circuit for delivering the first initial voltage signal, as an RF AGC voltage which serves as a part of the automatic gain control voltage signal, during a predetermined time duration on reception of the channel selection signal or when power supply is turned to on. The RF AGC control circuit delivers a second level difference signal, as the RF AGC voltage, representative of a second level difference between the preselected level and the first level difference after lapse of the predetermined time duration. The automatic gain control circuit still further comprises an IF AGC control circuit connected to the comparator and the second initial level generating circuit for delivering the second initial voltage signal, as an IF AGC voltage which serves as another part of the automatic gain control voltage signal, during the predetermined time duration on reception of the channel selection signal or when the power supply is turned to on. The IF AGC control circuit delivers the first level difference signal, as the IF AGC voltage, after lapse of the predetermined time duration.

According to another aspect of this invention, a reception front end device comprises an automatic gain control circuit which comprises a level detection circuit for detecting a reception level by utilizing an output signal produced from a demodulation circuit of a television signal. The automatic gain control circuit produces an automatic gain control voltage signal according to the reception level and further comprises: a reference level generating circuit for generating a reference voltage signal having a predetermined reference level; a comparator for comparing the reception level with the predetermined reference level to produce a first level difference signal representative of a first level difference between the reception level and the predetermined reference level; a first initial level generating circuit for generating a first initial voltage signal having a first initial level; a second initial level generating circuit for generating a second initial voltage signal having a second initial level; an optimum level generating circuit supplied with a channel selection signal designating a reception channel for generating a channel reference level signal having a preselected level that corresponds to the reception channel designated by the channel selection signal; an RF AGC control circuit connected to the comparator, the first initial level generating circuit, and the optimum level generating circuit for delivering the first initial voltage signal, as an RF AGC voltage which serves as a part of the automatic gain control voltage signal, during a predetermined time duration on reception of the channel selection signal or when power supply is turned to on. The RF AGC control circuit delivers a second level difference signal, as the RF AGC voltage, representative of a second level difference between the preselected level and the first level difference after lapse of the predetermined time duration. The automatic gain control circuit still further comprises an IF AGC control circuit connected to the comparator and the second initial level generating circuit for delivering the second initial voltage signal, as an IF AGC voltage which serves as another part of the automatic gain control voltage signal, during the predetermined time duration on reception of the channel selection signal or when the power supply is turned to on. The IF AGC control circuit delivers the first level difference signal, as the IF AGC voltage, after lapse of the predetermined time duration. The reception front end device further comprises: a tuner supplied with a radio frequency signal and comprising an RF amplifier circuit controlled by the RF AGC voltage. The tuner selects the reception channel designated by the channel selection signal and converts the radio frequency signal into an intermediate frequency signal having an intermediate frequency. The reception front end device further comprises an IF circuit supplied with the intermediate frequency signal and comprising an IF amplifier circuit controlled by the IF AGC voltage to produce an amplified intermediate frequency signal and the demodulation circuit for demodulating the amplified intermediate frequency signal into the output signal.

BRIEF DESCRIPTION OF THE PREFERRED EMBODIMENT

Figure 1:
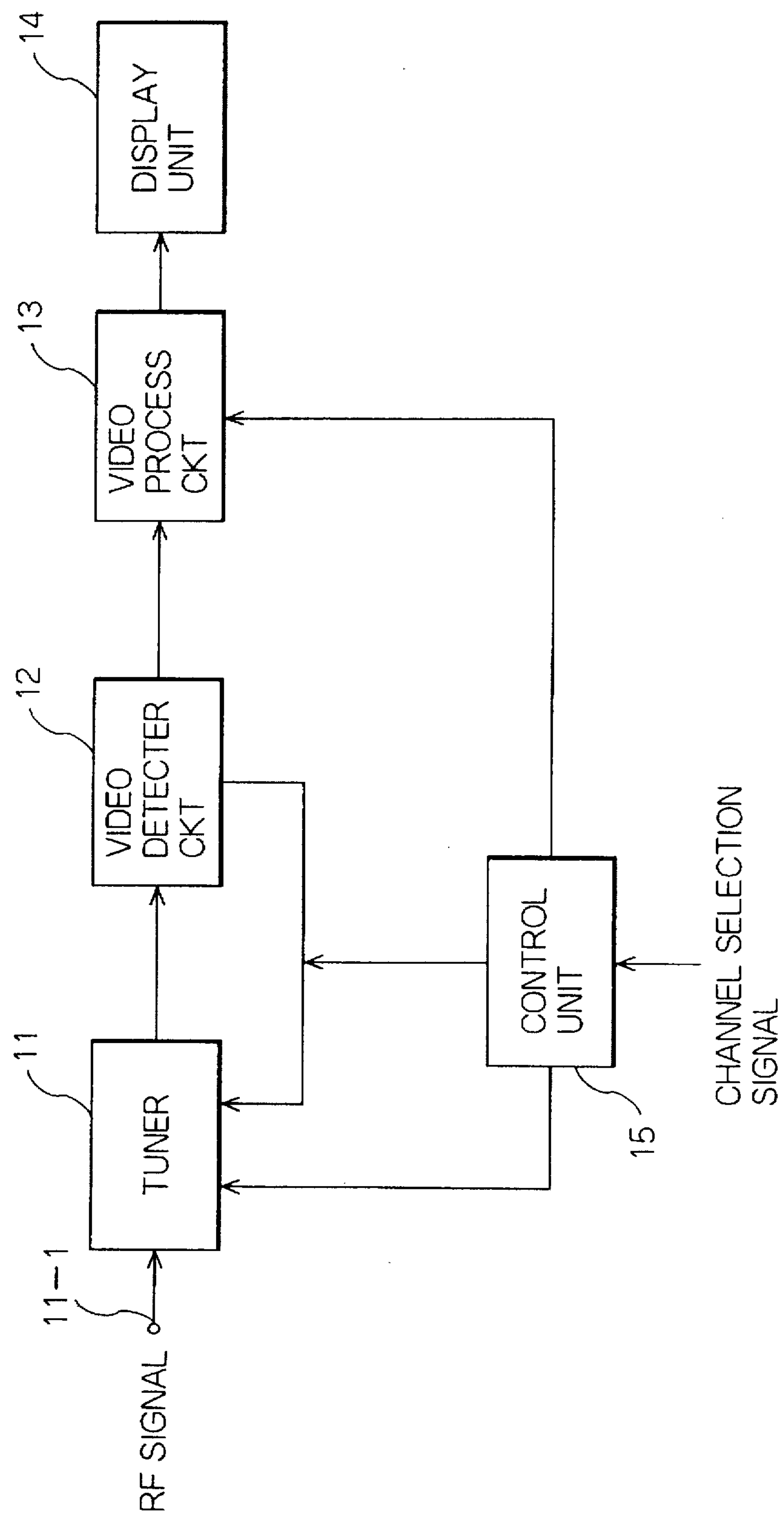
FIG. 1 shows a block diagram of a conventional reception front end device.

Referring to FIG. 1, description will be made with regard to a conventional reception front end device included in a television receiver in order to facilitate a better understanding of the present invention. Such a reception front end device is disclosed in Japanese Unexamined Patent Publication No. Tokkai Hei 4-271585 (271585/1992).

The reception front end device comprises a tuner 11, a visual detector circuit 12, a visual process circuit 13, a display unit 14, and a control unit 15. The tuner 11 comprises a tuning circuit, an RF (Radio Frequency) amplifier circuit, and a frequency converting circuit all of which are not shown. The tuning circuit is supplied with an RF (Radio Frequency) signal through an input terminal 11-1 and selects a specific frequency signal of a specific channel, namely, a reception channel, designated by a channel switching signal. The RF amplifier circuit amplifies the specific frequency signal into an amplified frequency signal. The frequency converting circuit converts the amplified frequency signal into an IF (Intermediate Frequency) signal.

The visual detector circuit 12 converts the IF signal into a composite video signal. The visual detector circuit 12 feeds an RF AGC voltage to the tuner 11. The visual process circuit 13 converts the composite video signal into an R (Red) signal, a G (Green) signal, and a B (Blue) signal or a luminance (or brightness) signal and a color-difference signal. The display unit 14 displays outputs of the visual process circuit 13 as a visual image.

The control unit 15 is implemented by a microcomputer and is supplied with a channel selection signal from an outer unit (not shown). The channel selection signal is for designating one of a plurality of channels as the reception channel. Responsive to the channel selection signal, the control unit 15 delivers the channel switching signal to the tuner 11. The control unit 15 controls the RF AGC voltage by the use of an RF AGC (Automatic Gain Control) voltage control signal. The RF amplifier circuit is controlled in amplification degree by the RF AGC voltage controlled by the control unit 15. For this purpose, the control unit 15 comprises a memory unit (not shown) memorizing a plurality of AGC voltage control information in each of the plurality of channels. By the use of the plurality of AGC voltage control information, the control unit 15 controls the RF amplifier circuit so that the IF signal has an appropriate level. Thus, the tuner 11 is controlled in gain thereof by one of the plurality of AGC voltage control information corresponding to the reception channel that is designated by the channel selection signal. The tuner 11 produces the IF signal having the appropriate level.

The memory unit included in the control unit 15 further memorizes control information in each of the plurality of channels for the visual process circuit 13. The control information are for controlling brightness and image quality. By the use of the control information, the control unit 15 controls the visual process circuit so that an appropriate visual image can be obtained.

As mentioned above, the control unit 15 controls the tuner 11 in gain by the use of the plurality of AGC voltage control information stored in the memory unit in accordance with the reception channel. In other words, only the amplification degree of the tuner 11 is controlled.

The input terminal 11-1 is often connected to a CATV (Cable Television) cable and supplied with the RF signal through the CATV cable. In this event, there is a case that the CATV cable is provided with an amplifier because the CATV cable has no uniform frequency characteristic and so as to compensate a loss caused by the CATV cable. The frequency characteristic of the amplifier changes in accordance with a frequency band to be received. In other words, the frequency characteristic is different in each of the amplifiers. This means that there is a case the RF signal supplied with the tuner 11 has a large level variation.

When the tuner 11 receives a wire-less RF signal, it occasionally causes the case that the RF signal has the large level variation.

Since each of the plurality of AGC voltage control information is a fixed value in each of the plurality of channels, it is impossible to compensate the large level variation of the RF signal by only controlling the amplification degree of the RF amplifier circuit, when the tuner 11 received the RF signal has the large level variation larger than it had expected.

Figure 2:
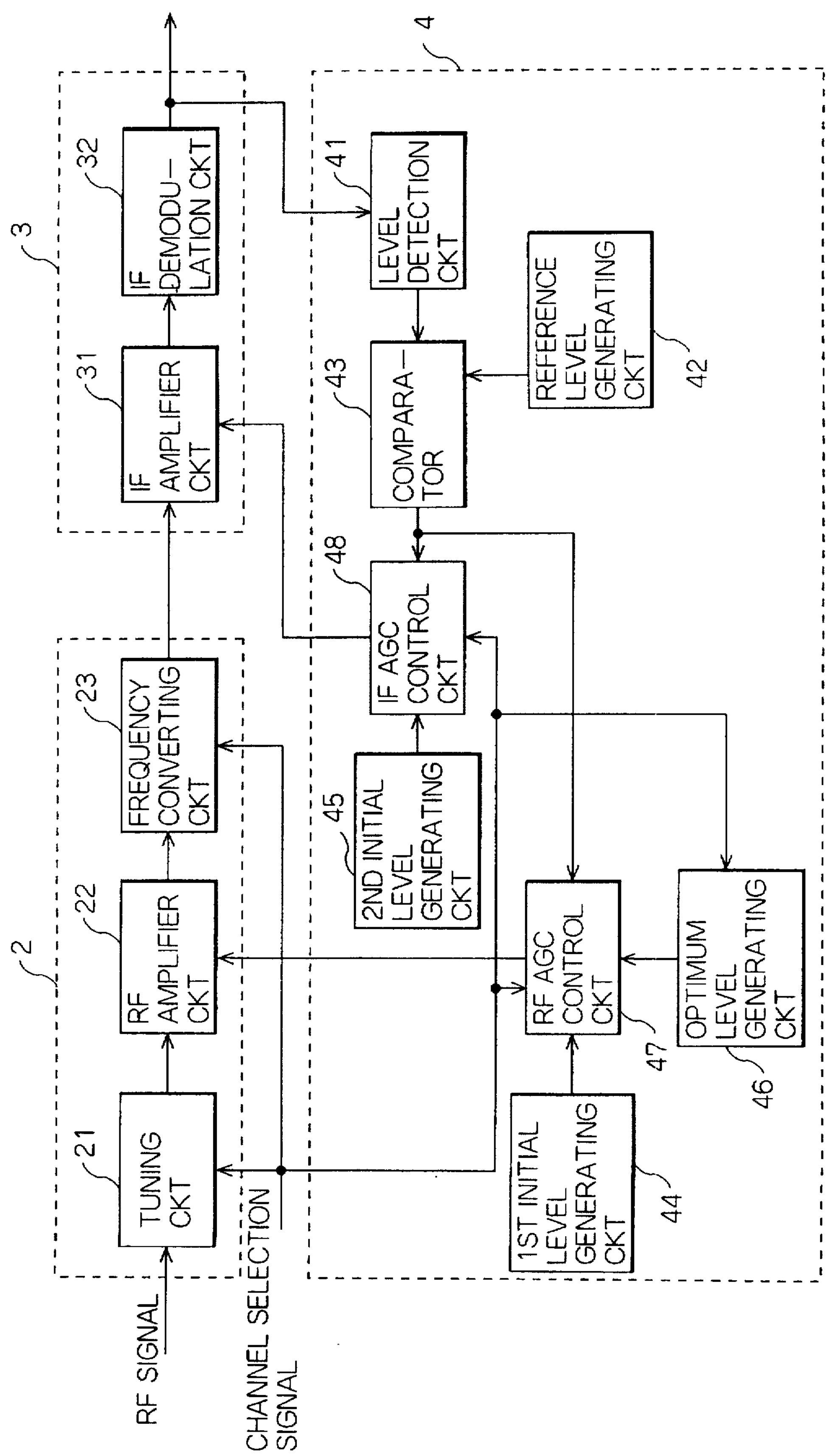
FIG. 2 shows a block diagram of a reception front end device according to a preferred embodiment of this invention.

Referring to FIG. 2, the description will proceed to a reception front end device according to a preferred embodiment of this invention. The reception front end device is particularly suitable for a television receiver and comprises a tuner 2, an IF (Intermediate Frequency) circuit 3, and an automatic gain control circuit 4.

The tuner 2 comprises a tuning circuit 21, an RF amplifier circuit 22, and a frequency converting circuit 23. The tuning circuit 21 is supplied with an RF (Radio Frequency) signal and selects a specific frequency signal of a specific channel, namely, a reception channel, designated by a channel selection signal. The RF amplifier circuit 22 is controlled in amplification degree by an RF AGC voltage supplied from the automatic gain control circuit 4 and amplifies the specific frequency signal into an amplified RF signal. The frequency converting circuit 23 converts the amplified RF signal into an IF (Intermediate Frequency) signal having a predetermined intermediate frequency.

The IF circuit 3 comprises an IF amplifier circuit 31 and an IF demodulation circuit 32. The IF amplifier circuit 31 is controlled in amplification degree by an IF AGC voltage supplied from the automatic gain control circuit 4 and amplifies the IF signal into an amplified IF signal. The IF demodulation circuit 32 demodulates the amplified IF signal into a composite TV (Television) signal of the reception channel and produces the composite TV signal as an output signal.

The automatic gain control circuit 4 comprises a level detection circuit 41. The level detection circuit 41 detects a mean level of the output signal as a detected level. The detected level is regarded as a reception level of the RF signal. A reference level generating circuit 42 is for generating a reference voltage signal having a predetermined reference level. A comparator 43 is for comparing the detected level with the predetermined reference level to produce a first level difference signal representative of a first level difference between the detected level and the predetermined reference level. A first initial level generating circuit 44 is for generating a first initial voltage signal having a first initial level. A second initial level generating circuit 45 is for generating a second initial voltage signal having a second initial level. An optimum level generating circuit 46 is supplied with a channel selection signal designating a reception channel and generates a channel reference level signal having a preselected level that corresponds to the reception channel designated by the channel selection signal.

An RF AGC control circuit 47 is connected to the comparator 43, the first initial level generating circuit 44, and the optimum level generating circuit 46. The RF AGC control circuit 47 delivers the first initial voltage signal, as the RF AGC voltage, during a predetermined time duration T on reception of the channel selection signal, or when the channel selection signal was updated, or when power supply is turned to on. Furthermore, the RF AGC control circuit 47 delivers a second level difference signal, as the RF AGC voltage, representative of a second level difference between the preselected level and the first level difference after lapse of the predetermined time duration T.

An IF AGC control circuit 48 is connected to the comparator 43 and the second initial level generating circuit 45. The IF AGC control circuit 48 delivers the second initial voltage signal, as the IF AGC voltage, during the predetermined time duration T on reception of the channel selection signal, or when the channel selection signal was updated, or when the power supply is turned to on. The IF AGC control circuit 48 delivers the first level difference signal, as the IF AGC voltage, after lapse of the predetermined time duration T.

Referring to FIG. 2, the optimum level generating circuit 46 comprises a channel table memory 46-1 and a channel decision unit 46-2. The optimum level generating circuit 46 memorizes a plurality of channel reference levels corresponding to a plurality of channels, respectively. The channel decision unit 46-2 is supplied with the channel selection signal and decides the channel designated by the channel selection signal as the reception channel. On reference to the channel table memory 46-1, the channel decision unit 46-2 delivers the channel reference level signal having one of the plurality channel reference levels, as the preselected level, that corresponds to the reception channel.

Figure 3:
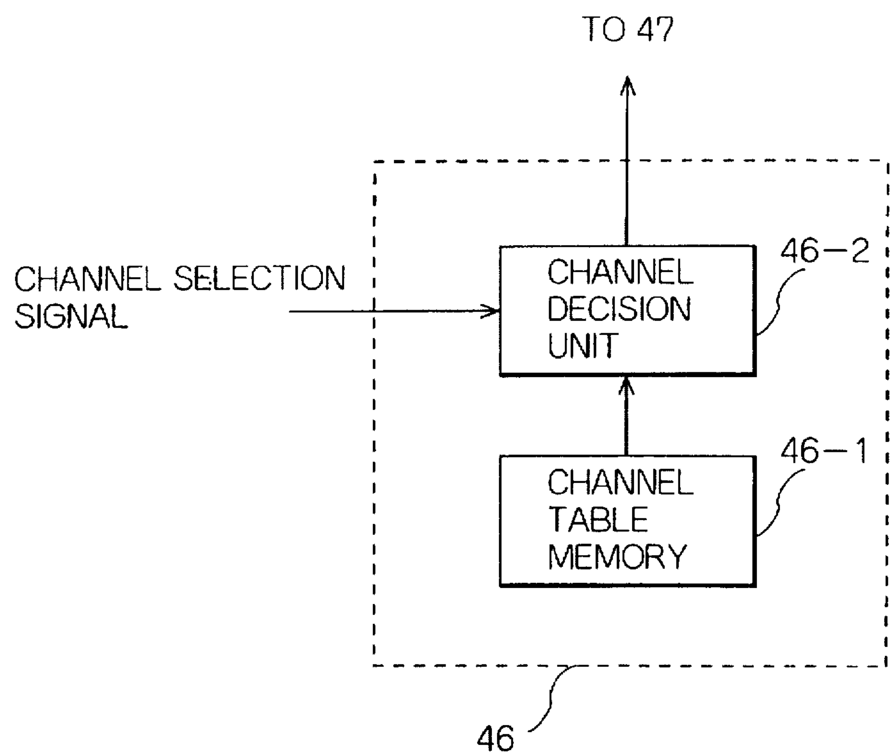
FIG. 3 shows a block diagram of an optimum level generating circuit illustrated in FIG. 1.
Figure 4:
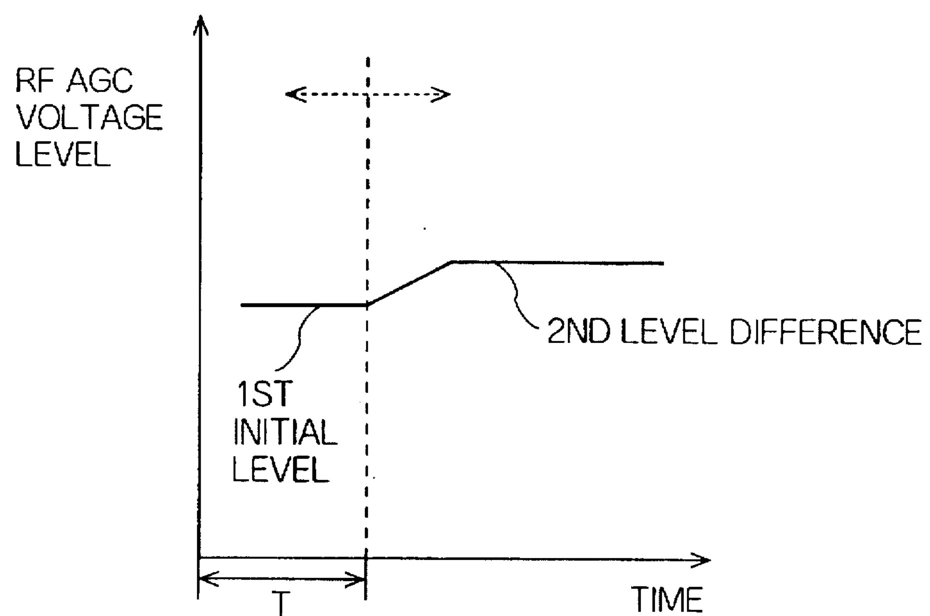
FIG. 4 is an illustration for use in describing operation of an RF AGC control circuit illustrated in FIG. 1.
Figure 5:
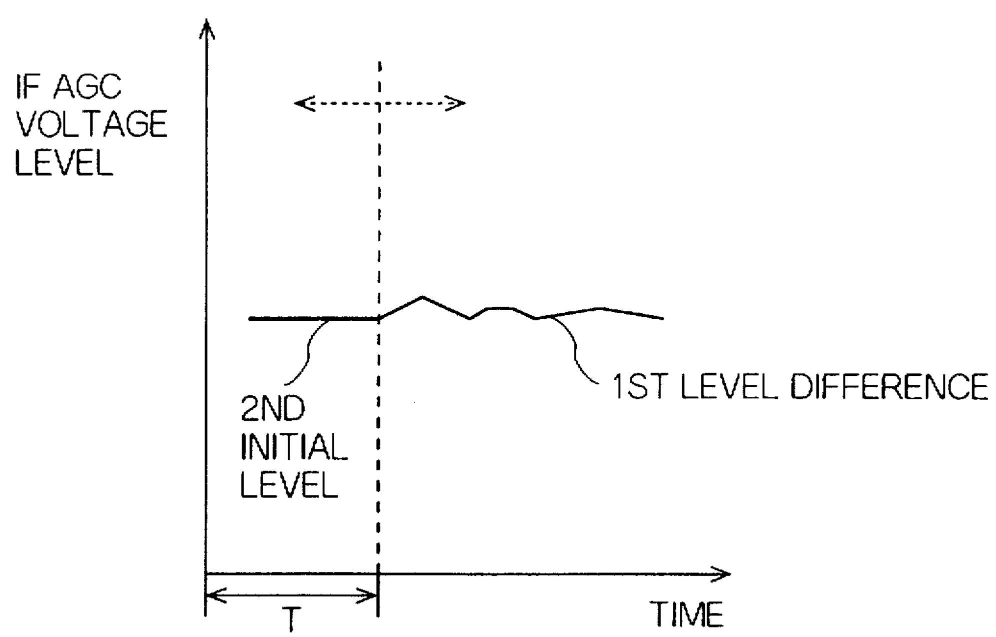
FIG. 5 is an illustration for use in describing operation of an IF AGC control circuit illustrated in FIG. 1.

Referring to FIGS. 3 and 4 together with FIG. 1, operation of the reception front end device will be described. Generally, the television receiver is provided with a channel selection unit which is for designating the reception channel. For example, the channel selection unit is implemented by a plurality of selection buttons. When one of the plurality of selection buttons is pushed, the channel selection signal is generated. The channel selection signal designates the channel corresponding to one of the plurality of selection buttons that was pushed. The channel selection signal is received by the optimum level generating circuit 46, the RF AGC control circuit 47, and the IF AGC control circuit 48.

The RF AGC control circuit 47 selects the first initial voltage signal, as the RF AGC voltage, generated by the first initial level generating circuit 44, each time when the channel selection signal is updated. The first initial voltage signal is supplied to the RF amplifier circuit 22 during the predetermined time duration T as shown in FIG. 3. The RF AGC control circuit 47 carries out the same operation when the power supply for the automatic gain control circuit 4 was turned to on. In other words, the RF AGC control circuit 47 decides that the channel selection signal was updated, when the power supply was turned to on.

On the other hand, the optimum level generating circuit 46 decides the reception channel designated by the channel selection signal and then selects the channel reference level, as a selected channel reference level, from the plurality of channel reference levels which are stored in the channel table memory 46-1 (FIG. 2). The selected channel reference level corresponds to the reception channel and is delivered to the RF AGC control circuit 47.

As shown in FIG. 3, the RF AGC control circuit 47 delivers the second level difference signal, as the RF AGC voltage, representative of the second level difference between the preselected level and the first level difference after lapse of the predetermined time duration T.

As illustrated in FIG. 4, the IF AGC control circuit 48 selects the second initial voltage signal produced from the second initial level generating circuit 45 each time when the channel selection signal was updated. The IF AGC control circuit 48 delivers the second initial voltage signal, as the IF AGC voltage, to the IF amplifier circuit 31 during the predetermined time duration T.

On the other hand, the level detection circuit 41 detects the mean level of the output signal as the detected level. The comparator 43 compares the detected level with the predetermined reference level generated by the reference level generating circuit 42 and produces the first level difference signal representative of the first level difference between the detected level and the predetermined reference level. After a lapse of the predetermined time duration T, the IF AGC control circuit 48 selects the first level difference signal produced from the comparator 43 and delivers the first level difference signal, as the IF AGC voltage, as shown in FIG. 4. The IF AGC control circuit 44 controls the gain of the IF amplifier circuit 31 so that the first level difference becomes to zero.

As mentioned above, when the power supply is turned to on, or when the channel selection signal was updated, the automatic gain control circuit 4 gives the first initial level and the second initial level to the RF amplifier circuit 22 and the IF amplifier circuit 31 as the RF AGC voltage and the IF AGC voltage, respectively, during the predetermined time duration T. As a result, the gains of the RF amplifier circuit 22 and the IF amplifier circuit 31 are kept at a constant value regardless of the reception channel. After a lapse of the predetermined time duration T, the RF amplifier circuit 22 is supplied from the RF AGC control circuit 47 with the RF AGC voltage that is the second level difference between the channel reference level corresponding to the reception channel and the first level difference produced from the comparator 43. Even if the IF signal has a lower level as a result of a lower reception level of the reception channel, it is possible to keep the output of the IF amplifier circuit 31 at a constant value by increasing the gain of the IF amplifier circuit 31 under the control of the IF AGC voltage.

What is claimed is:

1. An automatic gain control circuit comprising a level detection circuit for detecting a reception level by utilizing an output signal produced from a demodulation circuit of a television signal, said automatic gain control circuit producing an automatic gain control voltage signal according to said reception level and further comprising:

- a reference level generating circuit for generating a reference voltage signal having a predetermined reference level;
- a comparator for comparing said reception level with said predetermined reference level to produce a first level difference signal representative of a first level difference between said reception level and said predetermined reference level;
- a first initial level generating circuit for generating a first initial voltage signal having a first initial level;
- a second initial level generating circuit for generating a second initial voltage signal having a second initial level;
- an optimum level generating circuit supplied with a channel selection signal designating a reception channel for generating a channel reference level signal having a preselected level that corresponds to the reception channel designated by said channel selection signal;
- an RF AGC control circuit connected to said comparator, said first initial level generating circuit, and said optimum level generating circuit for delivering said first initial voltage signal, as an RF AGC voltage which serves as a part of said automatic gain control signal, during a predetermined time duration on reception of said channel selection signal or when power supply is turned to on, said RF AGC control circuit delivering a second level difference signal, as said RF AGC voltage, representative of a second level difference between said preselected level and said first level difference after lapse of said predetermined time duration; and
- an IF AGC control circuit connected to said comparator and said second initial level generating circuit for delivering said second initial voltage signal, as an IF AGC voltage which serves as another part of said automatic gain control signal, during said predetermined time duration on reception of said channel selection signal or when said power supply is turned to on, said IF AGC control circuit delivering said first level difference signal, as said IF AGC voltage, after lapse of said predetermined time duration.

2. An automatic gain control circuit as claimed in claim 1, wherein said optimum level generating circuit comprises:

- a channel table memory for memorizing a plurality of channel reference levels corresponding to a plurality of channels, respectively; and
- a channel decision unit supplied with said channel selection signal for deciding the channel designated by said channel selection signal as said reception channel and delivering the channel reference level signal having one of said plurality of channel reference levels, as said preselected level, that corresponds to said reception channel on reference to said channel table memory.

3. A reception front end device comprising an automatic gain control circuit which comprises a level detection circuit for detecting a reception level by utilizing an output signal produced from a demodulation circuit of a television signal, said automatic gain control circuit producing an automatic gain control voltage signal according to said reception level and further comprising:

- a reference level generating circuit for generating a reference voltage signal having a predetermined reference level;
- a comparator for comparing said reception level with said predetermined reference level to produce a first level difference signal representative of a first level difference between said reception level and said predetermined reference level;
- a first initial level generating circuit for generating a first initial voltage signal having a first initial level;
- a second initial level generating circuit for generating a second initial voltage signal having a second initial level;
- an optimum level generating circuit supplied with a channel selection signal designating a reception channel for generating a channel reference level signal having a preselected level that corresponds to the reception channel designated by said channel selection signal;
- an RF AGC control circuit connected to said comparator, said first initial level generating circuit, and said optimum level generating circuit for delivering said first initial voltage signal, as an RF AGC voltage which serves as a part of said automatic gain control signal, during a predetermined time duration on reception of said channel selection signal or when power supply is turned to on, said RF AGC control circuit delivering a second level difference signal, as said RF AGC voltage, representative of a second level difference between said preselected level and said first level difference after lapse of said predetermined time duration; and
- an IF AGC control circuit connected to said comparator and said second initial level generating circuit for delivering said second initial voltage signal, as an IF AGC voltage which serves as another part of said automatic gain control signal, during said predetermined time duration on reception of said channel selection signal or when said power supply is turned to on, said IF AGC control circuit delivering said first level difference signal, as said IF AGC voltage, after lapse of said predetermined time duration;

said reception front end device further comprising:

- a tuner supplied with a radio frequency signal and comprising an RF amplifier circuit controlled by said RF AGC voltage, said tuner selecting the reception channel designated by said channel selection signal and converting the radio frequency signal into an intermediate frequency signal having an intermediate frequency; and
- an IF circuit supplied with said intermediate frequency signal and comprising an IF amplifier circuit controlled by said IF AGC voltage to produce an amplified intermediate frequency signal and said demodulation circuit for demodulating said amplified intermediate frequency signal into said output signal.

4. A reception front end device as claimed in claim 3, wherein said optimum level generating circuit comprises:

a channel table memory for memorizing a plurality of channel reference levels corresponding to a plurality of channels, respectively; and a channel decision unit supplied with said channel selection signal for deciding the channel designated by said channel selection signal as said reception channel and delivering the channel reference level signal having one of said plurality of channel reference levels, as said preselected level, that corresponds to said reception channel on reference to said channel table memory.

* * * * *